United States Patent [19]

Kotecha et al.

[11] Patent Number: 5,143,820
[45] Date of Patent: Sep. 1, 1992

[54] METHOD FOR FABRICATING HIGH CIRCUIT DENSITY, SELF-ALIGNED METAL LINENS TO CONTACT WINDOWS

[75] Inventors: Harish N. Kotecha, Manassas, Va.; Hans A. Protschka, Gaithersburg, Md.; Dave Stanasolovich, Ithaca, N.Y.; Jake Theisen, Austin, Tex.

[73] Assignee: International Business Machines Corporation, Armonk, N.Y.

[21] Appl. No.: 730,504

[22] Filed: Jul. 11, 1991

Related U.S. Application Data

[63] Continuation of Ser. No. 429,900, Oct. 31, 1989, abandoned.

[51] Int. Cl.$^5$ .................. G03C 5/00; H01L 21/306
[52] U.S. Cl. .................. 430/314; 430/316; 430/318; 430/319
[58] Field of Search ............... 430/314, 316, 317, 318, 430/319

[56] References Cited

U.S. PATENT DOCUMENTS

| | | | |
|---|---|---|---|
| 3,930,857 | 1/1976 | Bendz et al. | 427/82 |
| 4,579,812 | 4/1986 | Bower | 430/316 |
| 4,702,792 | 11/1987 | Chow et al. | 430/314 |

Primary Examiner—Marion E. McCamish
Assistant Examiner—S. Rosasco
Attorney, Agent, or Firm—Jeffrey S. LaBaw

[57] ABSTRACT

A method is disclosed for fabricating patterned conductive lines which are self-aligned with underlying contacts windows. A layer of a photosensitive material such photoresist is formed over a dielectric layer. The photoresist layer is processed to have fully developed areas corresponding to contact windows, partially developed areas corresponding to the patterned conductive lines and undeveloped areas which correspond to field areas where the entire dielectric layer is maintained. The dielectric layer is preferably a compound dielectric layer to reduce interlevel shorts. Through the use of selective etch steps, the compound dielectric layers aid in the formation of the patterned conductive line and contact window structure. A series of reactive ion etch (RIE) steps are performed. The first RIE step, highly selective to dielectric material as compared to photoresist, etches the fully developed areas at least partially through the dielectric thickness. In the second RIE step, the photoresist which proteced dielectric in the conductive line areas is removed. The third RIE step is also selective to dielectric material as compared to photoresist and etches the dielectric to form channels where the conductive lines are formed, and completes the etching in the contact window areas. The remaining resist is then removed. The channels and contacts are overfilled with a deposition of a conductive material. This conductive material is then planarized by either a RIE process or a chemical-mechanical polishing step.

26 Claims, 3 Drawing Sheets

METHOD FOR FABRICATING HIGH CIRCUIT DENSITY, SELF-ALIGNED METAL LINENS TO CONTACT WINDOWS

This application is a continuation of application Ser. No. 07/429,900, filed Oct. 31, 1989, now abandoned.

BACKGROUND OF THE INVENTION

1. Technical Field

Generally, this invention relates to semiconductor processing using photosensitive materials on a substrate. More particularly, it relates to a method of providing a metal interconnecting wiring layer which is self-aligned to an underlying contact window.

2. Background Art

There is a continuing effort in the semiconductor industry to devise new methods of increasing the circuit density of VLSI devices to increase the speed and performance of microprocessors. The devices fabricated on a semiconductor chip are typically interconnected by a number of conductive metal layers separated from each other by dielectric material. These metal layers are connected to each other and to the underlying devices either by vias, or contact windows, which are holes in the dielectric which allow an upper conductive layer to descend through the dielectric to make electrical contact with a lower layer. Another common approach to interconnect the metal layers is by the use of separate stud layers of conductive material. The requirement to maintain a sufficient contact area between the metal layer and the contact window or stud level necessitates an increase in the dimensions of the various features in the metal and window, or stud layers, to compensate for overlay errors and process bias inherent in lithographic processes. This increase in the size of the design ground rules results in a significant loss in circuit layout density. In addition, millions of dollars are spent annually on photolithographic equipment and processes to make improvements in overlay error and process bias. To minimize the chip area devoted to overlay tolerance and lithography costs, many "self-aligned" processes have been developed by process engineers.

In addition to the loss of chip area due to overlay tolerances, there are many problems in manufacturing stud layers and contact windows at the dimensions which the semiconductor industry is developing for the next generation of integrated circuits. In the prior art, the metal stud level is typically formed by a lift-off process. At dimensions of 1.5 microns or less, it becomes increasingly difficult to assure good adhesion of the metal stud to the metal layer on which it is situated. Therefore, the metal studs have a tendency to be removed with the rest of the lift-off layer, thus creating an open circuit. Where contact windows are etched into a dielectric layer, the sides of the contact windows must be sloped to guarantee good continuity of the metal layer as it descends into the contact window. The steeper the slope, the more likely it is the metallurgy will have breaks at the edges of the contact windows. However, the use of a gradually sloped sidewall to guarantee metal line continuity takes up valuable chip area and prevents contact windows from being packed as closely as desired. In addition, the use of contact windows creates a very irregular surface which makes subsequent interconnecting layers much more difficult to reliably fabricate.

One prior art method discussed in commonly assigned U.S. Pat. No. 4,789,648 to Chow, et al. was developed to address some of these concerns. In this method, a compound dielectric layer is deposited over a first layer of patterned conductive material. The compound dielectric layer consists of an etch stop layer patterned with contact holes sandwiched between two dielectric layers of a material such as silicon dioxide. A second photoresist layer is applied and patterned to define the upper level interconnecting layer. The upper layer of dielectric is then etched to the etch stop layer to form wiring channels. In those locations where the contact holes are exposed, the etching continues to form vertically sided contact windows which extend to the first layer of patterned conductive material. The channels and contact windows are filled with a metal layer, and the excess metal is removed by etching or by chemical-mechanical polishing.

While this process overcomes many of the deficiencies of the prior art, it is not a self-aligned process. Therefore, additional chip area is required to allow for overlay errors and processes bias. Two separate photolithography steps are required to form the contact holes and the wiring channels adding to the total lithographic tool count and process time required to manufacture the integrated circuit. Also, the process is designed specifically for fabricating metallurgy layers on existing metal layers, it does not provide for depositing metallurgy layers directly on semiconductor device.

SUMMARY OF THE INVENTION

It is therefore an object of the present invention to align an interconnecting wiring layer to an underlying contact window.

It is another object of the present invention to reduce the number of lithography steps in the interconnecting metallurgy process.

It is yet another object of the present invention to minimize the discontinuities between interconnecting metal layers.

It is still another object of the present invention to reduce the chip area required to compensate for overlay errors and process bias.

It is a further object of the present invention to provide a planar surface for further processing.

These objects and others are accomplished by forming a multiple thickness layer of a photosensitive material such as photoresist having fully developed areas, partially developed areas and undeveloped areas over a compound dielectric layer, these areas having no resist thickness, a partial resist thickness, and a full resist thickness, respectively. The fully developed areas are formed where the contact windows will make contact with underlying device contacts. The partially developed areas are formed where the interconnecting conductive lines are to be formed. The photoresist is left undeveloped over the field areas where the full dielectric layer is to be maintained.

After the multiple thickness photoresist layer is formed, a series of reactive ion etch (RIE) steps are performed. The first RIE step is highly selective to dielectric material as compared to photoresist and etches the contact windows most of the way through the dielectric layer. The photoresist over the conductive lines and the field areas protects the dielectric in the first etch step. The second RIE step removes the partially developed photoresist over the areas where the conductive lines are to be formed, but leaves some thickness of the undeveloped photoresist layer over the field areas. The third RIE step etches the remainder of the dielectric layer in the contact windows to the underlying device contacts or a first conductive line and etches the dielectric layer in the conductive line areas to a predetermined depth. Next, after removing the remaining photoresist, a conformal conductive layer is deposited over the entire wafer, completely filling the etched areas in the dielectric layer. Finally, the conductive layer is planarized, removing all excess metal from on top of the dielectric layer. The process can be repeated for subsequent conductive layers where the windows make contact with a preexisting patterned conductive layer.

BRIEF DESCRIPTION OF THE DRAWINGS

These and other features and advantages of the invention will be more fully appreciated with reference to the accompanying figures.

DETAILED DESCRIPTION OF THE PREFERRED EMBODIMENT

Semiconductor integrated circuit structures are generally fabricated on a wafer of semiconductor material. The wafer is a relatively large surface upon which many identical circuits are fabricated simultaneously. However, for purposes of illustration, only a small cross-section view is shown in the figures.

Figure 1A:
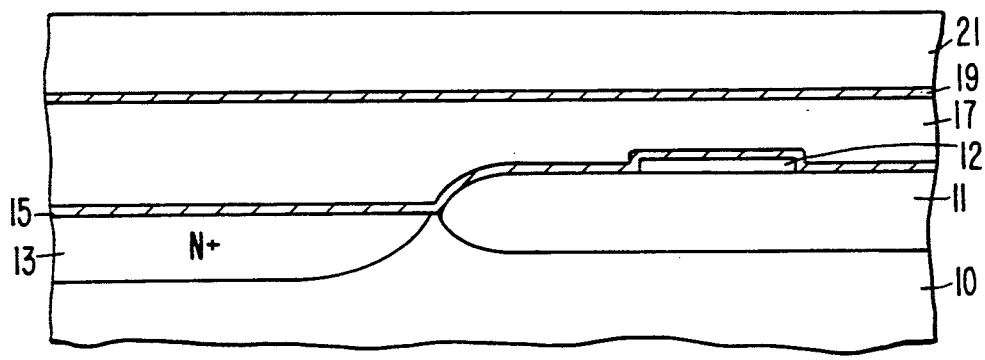
FIGS. 1A–1G are cross-sectional views of a CMOS integrated circuit shown during various stages of its fabrication in accordance with the process of the invention, FIG. 1G illustrating the completed integrated circuit structure.

As shown in FIG. 1A a cross-section of the semiconductor wafer 10 is shown. In a CMOS technology, the wafer 10 would preferably be p-type single crystal silicon. After the CMOS field effect transistors are fabricated, field oxide 11 is grown in the field areas of the wafer 10. A titanium silicide-polysilicon contact 12 is placed on the field oxide 11. The silicon wafer 10 will typically have various diffusion areas such as an N+ diffusion area 13 as depicted in FIG. 1A. The N+ diffusion area 13, field oxide 11 and TiSi$_2$/polysilicon contact 12 are formed by well known processes such as those described by C. Y. Ting et al. in "The use of TiSi$_2$ in a self-aligned silicide technology" VLS1 Science and Technology, edited by C. Dell'oca and U. M. Bullis, published by the Electrochemical Society, Pennington, N.J. 1982 p. 224. Next, an etch barrier film 15 such as silicon nitride is deposited to protect the polysilicon/-TiSi$_2$ contact from subsequent etch steps. Other barrier films may be used, however silicon nitride is preferred because it becomes part of the interlevel dielectric and has different etch characteristics than silicide regions. The use of silicon nitride allows a selective etch process to be easily developed. There are a number of well-known deposition processes to carry out silicon nitride deposition, including a low pressure chemical vapor deposition (CVD) process. A SiNx etch barrier of approximately 500 Angstroms in thickness is sufficient.

Next, a relatively thick layer of silicon oxide 17 or other similar dielectric material is deposited over the entire wafer. Two types of suitable silicon oxide layers are boro-phospho-silicate glass (BPSG) or low temperature oxide (L' O), both of which can be deposited by chemical vapor deposition processes. Preferably, this layer of dielectric is then planarized, either through a chemical mechanical polishing process, by a thermal reflow step or by a RIE step. In the preferred embodiment, the final silicon dioxide 17 thickness over the polysilicon 12 contact is at least 0.6 microns to assure the integrity of the polysilicon—TiSi$_2$ layer.

Next, a layer of a second dielectric 19, preferably silicon nitride, is deposited over the planarized silicon dioxide 17. The silicon nitride layer 19 is preferably thicker than the silicon nitride etch barrier film 15 and is on the order of 1000 Angstroms in thickness. Depending on the etch processes chosen, i.e., whether they are selective to other dielectric layers versus silicon nitride, this silicon nitride layer 19 can act as an etch stop barrier and as a mask layer for the contact windows in subsequent processing. There are a number of well-known deposition processes to carry out silicon nitride deposition, including a low pressure CVD deposition process.

A second layer 21 of the first dielectric, preferably silicon oxide, is deposited over the silicon nitride layer 19. The thickness of the second silicon oxide layer 21 is chosen to be equal to the thickness of the first layer interconnecting metallurgy plus an additional thickness of approximately 0.15 microns to account for dielectric losses during planarization. A typical metal interconnect thickness is one micron; for this thickness, the silicon dioxide layer 21 is at least 1.15 microns. It is possible that dielectric layers 17, 19 and 21 could be a single dielectric material. However, the use of a compound dielectric structure increases the reliability of an integrated circuit by reducing the number of interlevel shorts and pin holes in the aggregate dielectric layers. Also, as discussed before, the intermediary silicon nitride layer 19 can function as an etch stop layer and mask layer, if subsequent etch processing is chosen to be selective between the two types of dielectric layers.

Figure 1B:
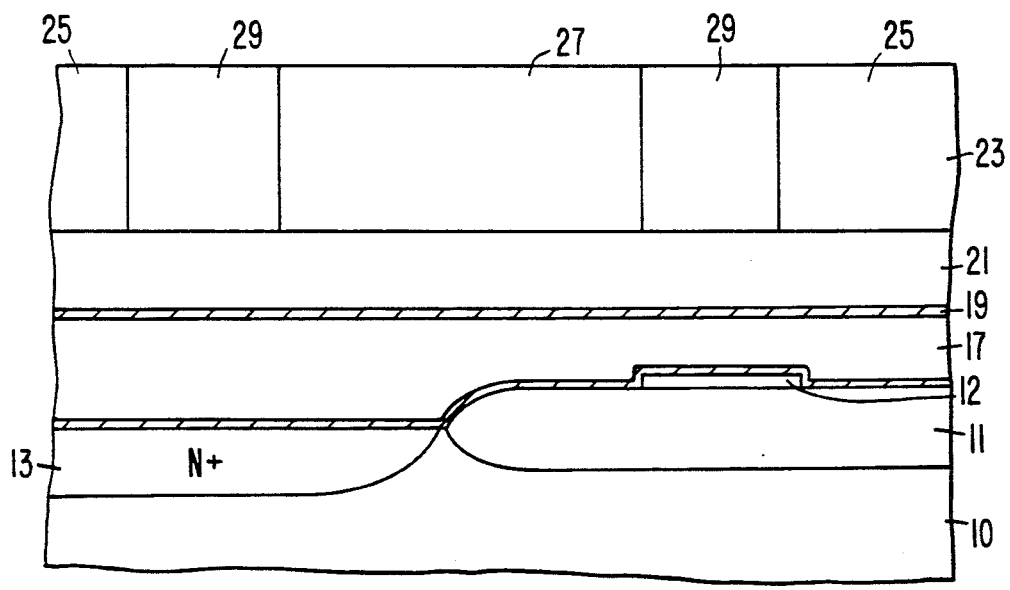

Referring to FIG. 1B, a layer of photoresist 23 is then applied on the structure. The use of a positive photoresist such as Shipley AZ 1350J ™ is depicted in this embodiment however, the present invention can include the use of a negative photoresist as well. The resist is of approximately 1.6 micron in thickness, A key feature of the present invention is that the photoresist layer must be patterned so that there are three different types of regions in the layer: a first set of regions where all the resist is to be retained, the field areas 25; a second set of regions where part of the resist is to be retained, the conductive line areas 27; and a third set of regions where all of the resist is to be removed, the contact window areas 29. The preferred means of obtaining such a resist structure is through the use of an optical stepper tool such as the GCA 6300B. An optical stepper of this type has a reticle management system (RMS) which can be used to expose up to ten different masks on the same chip site. The reticle-to-reticle overlay error is less than 0.025 microns, and therefore, the two reticles for the contact mask and the first level metal interconnects are essentially self-aligned to each other. Different exposures are used for each reticle to create the desired photoresist structure. In FIG. 1B photoresist areas 25 are completely unexposed. Given a 1.6 thickness of Shipley AZ 1350J ™ and a minimum line width of one micron, the conductive line areas 27 receive about 100 mJ/cm², and the contact window areas 29 receive about 250 mJ/cm². One skilled in the lithography art will recognize however, that these dosage levels will vary according to the resist system, exposure radiation frequency, line width and resist thickness used.

Other means of establishing such a resist profile would include variable doses from an electron beam lithography tool, or through the use of a gray level photomask which, in addition to the typical opaque and transparent regions, has a third set of regions which are half-opaque. An electron beam lithography tool can be programmed to change the exposure dose so that the contact window areas 29 receive higher levels than the conductive line areas 27. However, an electron beam tool is much slower than a stepper and for this reason is less preferred than the two reticle method. A gray level mask corresponding to FIG. 1B has completely opaque chrome areas, which block out the radiation of the lithography tool to field areas 25, and glass areas which allow a full radiation dose to be transmitted to contact window areas 29. In the third set of regions, the dose is reduced to the conductive line areas 27, either by the use of a chrome dot pattern, or by a dye layer deposited over the glass in those regions. The gray level masks are described in IBM Technical Disclosure Bulletin, Vol. 31, No. 7, December 1988, pp 286-87, entitled "Defining Stepped Resist Structure Using E-Beam and Implemented with Proximity Correction Software", by J. E. Cronin, et al. The two reticle method offers at least one advantage over the use of the gray level mask in that the dosages between contact areas 29 and conductive line areas 27 can be freely varied in the former method, while the dosages with the latter method are relatively fixed.

Figure 1C:
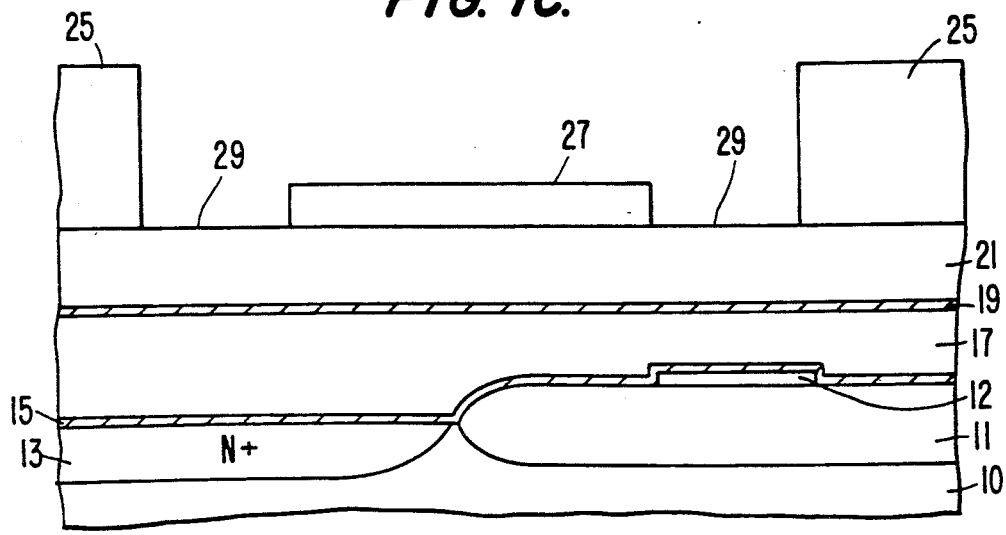

FIG. 1C shows the resulting resist profile after resist development. As shown in this figure, the contact window areas 29 are completely developed while the conductive line areas 27 are partially developed, leaving a partial thickness of photoresist in these areas. Field areas 25, where no wiring is to be formed, are left with the entire resist thickness. The difference in resist heights can be adjusted by altering the relative exposure doses for the contact window areas 29 and interconnecting metallurgy areas 27.

Next, a first RIE etch step is performed in the contact window areas 29. This etch step is performed in a conventional RIE reactor, and is highly selective to etch dielectric layers 21, 19, 17 as compared to the etch rate of the photoresist areas 27 and 25. Using an Applied Materials 8110 RIE reactor, suitable etch conditions are:

$CHF_3$ flow = 135 sccm $O_2$ flow = 15 sccm

Pressure = 50 mtorr

Figure 1D:
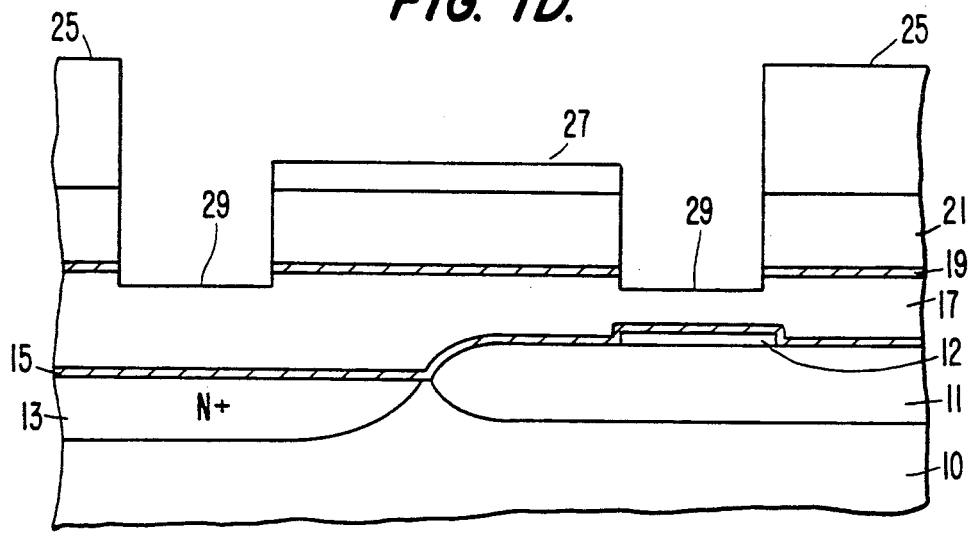

Ideally, the first etch step stops short of etching through the entire dielectric layer 17 to the etch stop layer 15. The partially developed resist in conductive line areas 27 prevents etching of the dielectric layer 21 in those areas where the first level conductive lines will be formed. The resulting structure is shown in FIG. 1D.

Figure 1E:
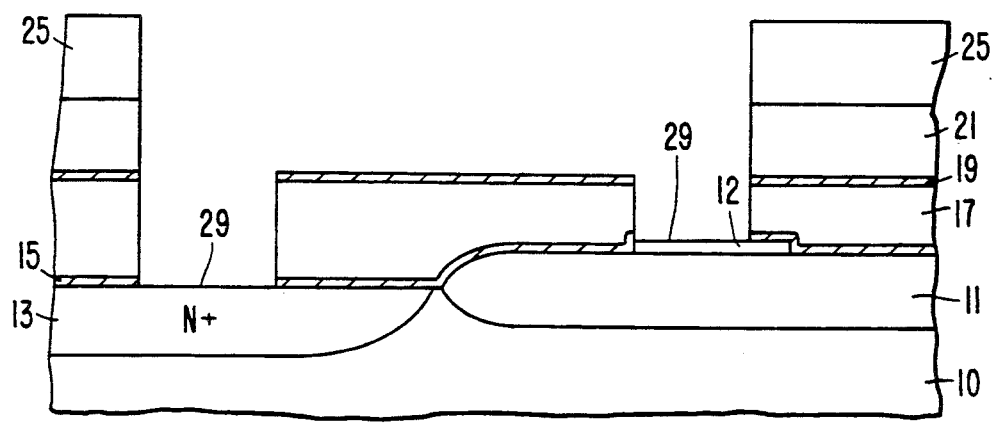

In FIG. 1E, the resist over the interconnecting metal areas 27 is removed by a second RIE process in a predominantly oxygen plasma. In the same type of conventional RIE reactor, etch conditions for the selective removal of photoresist are:

Voltage = −525 volts $O_2$ flow = 20 sccm

Pressure = 10 mTorr

While some of the undeveloped resist in field areas 25 is also reduced in thickness, enough thickness is retained to protect the dielectric layers 21, 19, 17 in those areas.

Next, a third RIE step removes the dielectric layer 21 over the conductive line areas 27 at high etch rate selectivity to silicon dioxide as compared to resist and silicon nitride layers 19 and 15. The remainder of dielectric layer 17 in the contact window areas 29 is also etched in the third RIE step. The following process conditions in a conventional RIE reactor may be used:

Voltage = 1000 watts $CHF_3$ flow = 90 SCCM $CF_4$ flow = 20 SCCM

Pressure = 50 mTorr

This process results in a silicon oxide to silicon nitride etch rate ratio of 6 to 1.

The etch barrier 15 is then etched away to reveal either the polysilicon/$TiSi_2$ contacts 12 or the N+ diffusion areas 13. Etch conditions in a conventional RIE reactor which yield a 10 to 1 etch rate selectivity for silicon nitride to silicide are:

Voltage = −600 volts $CHF_3$ flow = 135 sccm $O_2$ flow = 15 sccm

Pressure = 50 mTorr

Next, all remaining resist is removed either by another RIE etching step, an oxygen ash or by chemically stripping the remaining photoresist. All of the above etch steps can be performed in the same RIE process chamber or in adjoining process chambers of the same RIE system or in a second or third RIE tool. It should be recognized that the process conditions outlined above are representative of a particular preferred embodiment. The choice of different dielectric materials, RIE reactors or reactive gases will necessitate changes to the conditions outlined above.

Figure 1F:
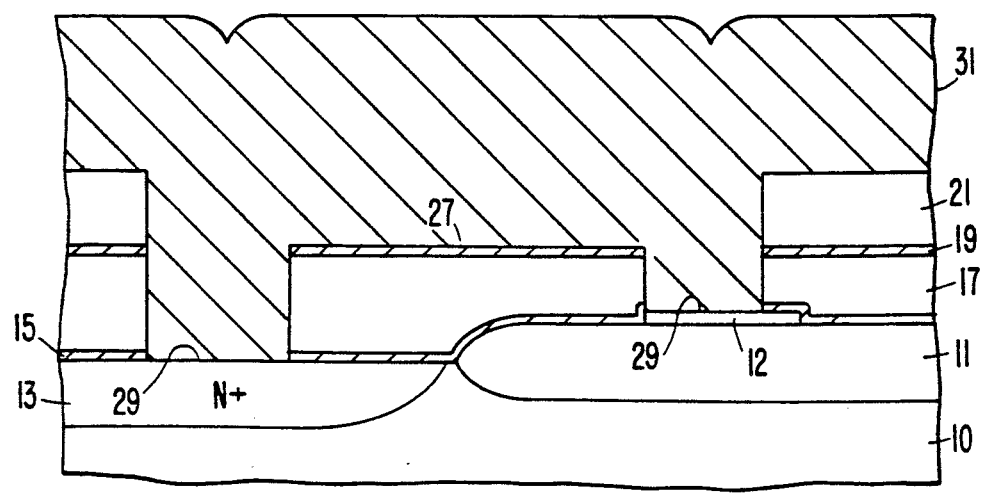

FIG. 1F depicts a cross-sectional view after a thick conductive layer 31 is deposited over the entire wafer. For fine line interconnection between semiconductor devices, the conductive layer 31 is preferably a metal, for example, CVD tungsten, or a combination of metals such as a sputtered compound metallurgy, e.g., aluminum, copper, and titanium. This metal layer 31 forms the contact in the contact window areas 29 studs and the first level interconnecting metallurgy in the conductive line areas 27. In some applications at larger geometries, doped polycrystalline silicon can be used as the conductive layer 31. Preferably, the conductive material 31 is deposited in a thickness sufficient to overfill all of the etched channels and contact window. The conductive layer 31 is then planarized either by an RIE etching step or a chemical-mechanical polishing step to remove the excess conductive material 31 from the top of the dielectric 21. Chemical-mechanical polishing can be achieved following the teachings of copending patent application Ser. No. 791,860, filed Oct. 28, 1985, entitled "Chemical-Mechanical Polishing Method for Producing Coplaner Metal/Insulator Films on a Substrate" by K. D. Beyer, et al. which is hereby incorporated by reference. The completed structure is depicted in FIG. 1G.

Figure 1G:
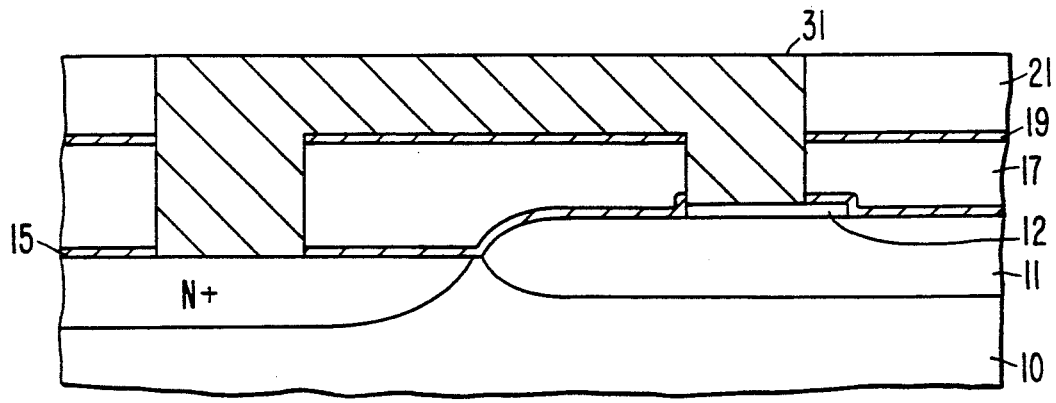
Figure 1H:
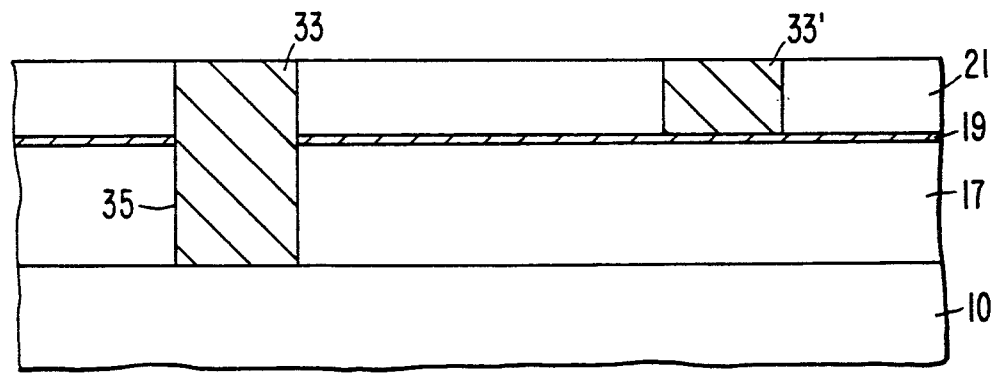
FIG. 1H is a cross-sectional view similar to FIG. 1G, rotated at 90 degrees to show the first level metal over a contact stud and the first level metal line over dielectric material.

FIG. 1H shows a cross-section of the circuit from a 90 degree angle from the cross-section shown in FIG. 1G. In FIG. 1H, certain first level wiring lines 33 are connected to the device layer by the contacts 35, whereas other wiring lines 33 are not connected.

Figure 2:
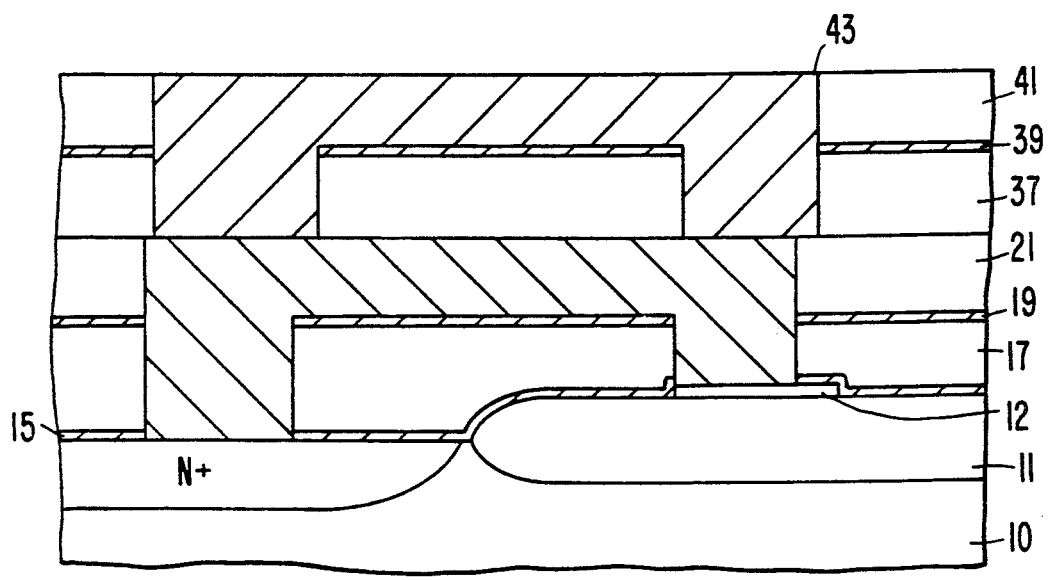
FIG. 2 is a cross-sectional view of a CMOS integrated circuit with two levels of metal built in accordance with the present invention.

As shown in FIG. 2, the fabrication techniques as shown in FIGS. 1A–1G can be extended to the fabrication of a multi-level wiring process. This structure is constructed by repeating the steps described above with exception of the first etch stop layer. After a third silicon dioxide layer 37, a third silicon nitride layer 39 and fourth silicon dioxide layer 41 are deposited, and channels and contact holes are etched in these layers. A conductive material 43 is deposited and planarized to provide a second layer of interconnection.

Although the preferred embodiment uses composite silicon oxide and silicon nitride deposited by CVD processes as a dielectric layer, other insulation materials, such as spin-on polyimides or sputtered quartz, are also suitable. Compatible etch stop materials include spin-on glass and plasma nitride where polyimide layers are used.

While the invention has been described with respect to the particular embodiment above, it would be understood by those skilled in the art that modification may be made without departing from the spirit and scope of the invention. For example, while the invention was described in connection with a CMOS integrated circuit, it has obvious application to silicon bipolar, GaAs FET, or other circuit technologies. Further, while the preferred embodiment discussed the formation of a pattern of conductive lines which interconnect devices in a semiconductor substrate, the present invention can be utilized to form any sort of patterned conductive layer self-aligned to a pattern of contact windows to an underlying substrate. This embodiment is for the purposes of illustration only and is not to be taken to limit the scope of the invention narrower than the scope of the appended claims.

We claim:

1. A method for fabricating a patterned conductive layer self-aligned to underlying contact windows in a dielectric layer on a substrate comprising the steps of:
   forming a photosensitive layer over said dielectric layer, said photosensitive layer having full height areas, partial height areas and no height areas over said dielectric layer, wherein said no height areas and said partial height areas are aligned to each other;
   in a first etching step, selectively etching said dielectric layer in said no height areas where said photosensitive layer is substantially totally removed to form contact windows which at least partially penetrate said dielectric layer;
   in a second etching step, selectively etching to remove said partial height areas of photosensitive layer;
   in a third etching step, etching said dielectric layer in said partial height areas to a predetermined depth to form channels for said patterned conductive layer, and in said no height areas entirely through said dielectric layer to form contact windows to said substrate;
   depositing a conductive material over said dielectric layer; and,
   planarizing said conductive layer to remove excess amounts of said conductive layer from said dielectric layer;
   wherein said second and third etching steps sequentially follow the previous etching step.

2. The method as recited in claim 1 wherein said dielectric layer is a compound dielectric layer formed from a first layer of a first dielectric material, a first layer of a second dielectric material, a second layer of said first dielectric material and second layer of said second dielectric material.

3. The method as recited in claim 2 wherein said first and second layers of said first dielectric material function as etch stop barriers, and said predetermined depth is equal to the thickness of said second layer of said second dielectric material.

4. The method as recited in claim 2 wherein said first dielectric material is silicon nitride and said second dielectric material is silicon oxide.

5. The method as recited in claim 1 wherein said conductive layer is a metal.

6. The method as recited in claim 1 wherein said conductive material is a compound metal.

7. The method as recited in claim 1 wherein said photosensitive layer is a positive photoresist layer.

8. A method for fabricating conductive lines self-aligned to underlying contact windows in a dielectric layer over a semiconductor substrate, comprising the steps of:
   forming an etch stop layer over said substrate;
   forming a dielectric layer over said substrate;
   forming a photoresist layer having no height areas in the pattern of said contacts, partial height areas in the pattern of said conductive lines and full height areas over said dielectric layer, wherein said no height areas and said partial height areas are aligned to each other;
   in a first etching step, selectively etching said dielectric layer in said areas where said photoresist is totally removed to form contact windows which at least partially penetrate said dielectric layer;
   in a second etching step, selectively etching away said partial height areas of photoresist;
   in a third etching step, etching said dielectric layer in said partial height areas to a predetermined depth to form channels for said conductive lines, and in said no height areas where said photoresist was fully developed entirely through said dielectric layer to form contacts to said semiconductor substrate;
   in a fourth etching step, etching through said etch stop layer where said contact windows are formed to contact with said semiconductor substrate;
   depositing a conductive layer over said dielectric layer, filling said contact windows and channels; and, planarizing said conductive layer to selectively remove excess amounts of said conductive layer from said dielectric layer;

wherein said second, third and fourth etching steps sequentially follow the previous etching step.

9. The method as recited in claim 8 wherein said dielectric layer is a compound dielectric layer formed from a first layer of a first dielectric material, a layer of a second dielectric material and a second layer of said first dielectric material.

10. The method as recited in claim 9 wherein said layer of said second dielectric material functions as an etch stop barrier.

11. The method as recited in claim 9 wherein said first dielectric material is silicon oxide and said second dielectric material is silicon nitride.

12. The method as recited in claim 8 wherein said conductive layer is a metal.

13. The method as recited in claim 8 which further comprises the steps of:

forming a second dielectric layer over said planarized conductive layer;

forming a second photoresist layer having no height areas in a second pattern of contact windows, partial height areas in a second pattern of conductive lines and full height areas over said second dielectric layer, wherein said no height areas and said partial height areas are aligned to each other;

in a fifth etching step, selectively etching said second dielectric layer in said no height areas where said second photoresist layer is totally removed to form contact windows which at least partially penetrate said dielectric layer;

in a sixth etching step, selectively etching away said partial height areas of said second photoresist layer;

in a seventh etching step, etching said second dielectric layer in said partial height areas to a predetermined depth to form channels for said conductive lines, and in said no height areas entirely through said dielectric layer to form contact windows which connect to said planarized conductive layer;

depositing a second conductive layer over said second dielectric layer, filling said contact windows and channels; and, planarizing said second conductive layer to selectively remove excess amount of said second conductive layer from said second dielectric layer to form a second planarized conductive layer;

wherein said sixth and seventh etching steps sequentially follow the previous etching step.

14. A method for fabricating a patterned conductive layer self-aligned to underlying contact windows in a dielectric layer on a substrate comprising the steps of:

depositing a photosensitive layer over said dielectric layer;

exposing a first set of areas of said photosensitive layer with an optical stepper using a first reticle, and exposing a second set of areas of said photosensitive layer with a optical stepper using a second reticle, using dosage levels chosen so that said first set of areas are fully exposed and said second set of areas are partially exposed, and said first and second sets of areas are self-aligned to each other;

developing said photosensitive layer so that said first set of areas has no photosensitive layer, said second set of areas has a partial height of a photosensitive layer and a third set of areas has a full photosensitive layer;

in a first etching step, selectively etching said dielectric layer in said first set of areas to form said contact windows which at least partially penetrate said dielectric layer;

in a second etching step, selectively etching away said second set of areas of said photosensitive layer;

in a third etching step, etching said dielectric layer in said second set of areas to a predetermined depth to form channels for said patterned conductive layer, and in said first set of areas entirely through said dielectric layer to form contact windows to said substrate;

depositing a conductive material over said dielectric layer; and, planarizing said conductive layer to remove excess amounts of said conductive layer from said dielectric layer;

wherein said second and third etching steps sequentially follow the previous etching step.

15. The method as recited in claim 14 wherein said dielectric layer is a compound dielectric layer formed from a first layer of a first dielectric material, a first layer of a second dielectric material, a second layer of said first dielectric material and second layer of said second dielectric material.

16. The method as recited in claim 15 wherein said first and second layers of said first dielectric material function as etch stop barriers, and said predetermined depth is equal to the thickness of said second layer of said second dielectric material.

17. The method as recited in claim 15 wherein said first dielectric material is silicon nitride and said second dielectric material is silicon oxide.

18. The method as recited in claim 14 wherein said conductive layer is a metal.

19. The method as recited in claim 14 wherein said conductive material is a compound metal.

20. The method as recited in claim 14 wherein said photosensitive layer is a positive photoresist layer.

21. A method for fabricating conductive lines self-aligned to underlying contact windows in a dielectric layer over a semiconductor substrate, comprising the steps of:

forming an etch stop layer over said substrate;

forming a dielectric layer over said substrate;

depositing a photosensitive layer over said dielectric layer, exposing a first set of areas of said photosensitive layer with an optical stepper using a first reticle in the pattern of said contact windows, and exposing a second set of areas of said photosensitive layer with a optical stepper using a second reticle in the pattern of said conductive lines, using dosage levels chosen so that said first set of areas are fully exposed and said second set of areas are partially exposed, and said first and second sets of areas are self-aligned to each other;

developing said photosensitive layer so that said first set of areas has no photosensitive layer, said second set of areas has a partial height of photosensitive layer and a third set of areas has a full photosensitive layer;

in a first etching step, selectively etching said dielectric layer in said areas where said photoresist is fully developed to form contact windows which partially penetrate said dielectric layer;

in a second etching step, selectively etching away said partially developed areas of photoresist;

in a third etching step, etching said dielectric layer in said second set of areas to a predetermined depth to form channels for said conductive lines, and in said first set of areas entirely through said dielectric layer to form contacts to said semiconductor substrate;

in a fourth etching step, etching through said etch stop layer at where said contact windows are formed to contact with said semiconductor substrate;

depositing a conductive layer over said dielectric layer, filling said contact windows and channels; and, planarizing said conductive layer to selectively remove excess amounts of said conductive layer from said dielectric layer;

wherein said second, third and fourth etching steps sequentially follow the previous etching step.

22. The method as recited in claim 21 wherein said dielectric layer is a compound dielectric layer formed from a first layer of a first dielectric material, a layer of a second dielectric material and a second layer of said first dielectric material.

23. The method as recited in claim 22 wherein said layer of said second dielectric material functions as an etch stop barrier.

24. The method as recited in claim 22 wherein said first dielectric material is silicon oxide and said second dielectric material is silicon nitride.

25. The method as recited in claim 21 wherein said conductive layer is a metal.

26. The method as recited in claim 21 which further comprises the steps of:

forming a second dielectric layer over said planarized conductive layer;

depositing a second photosensitive layer over said dielectric layer;

exposing a first set of areas of said photosensitive layer with an optical stepper using a first reticle in second pattern of contact windows, and exposing a fifth set of areas of said photosensitive layer with a optical stepper using a second reticle in a second pattern of conductive lines, using dosage levels chosen so that said fourth set of areas are fully exposed and said fifth set of areas are partially exposed, and said fourth and fifth sets are aligned to each other;

developing said photosensitive layer so that said fourth set of areas has no photosensitive layer, said fifth set of areas has a partial height of photosensitive layer and sixth set of areas has a full photosensitive layer;

in a fifth etching step, selectively etching said second dielectric layer in said fourth set areas to form contact windows which at least partially penetrate said dielectric layer;

in a sixth etching step, selectively etching away said fifth set of areas of said second photoresist layer;

in a seventh etching step, etching said second dielectric layer in said fifth set of areas to a predetermined depth to form channels for said conductive lines, and in said fourth set of areas entirely through said dielectric layer to form contact windows which connect to said planarized conductive layer;

depositing a second conductive layer over said second dielectric layer, filling said contact windows and channels; and, planarizing said second conductive layer to selectively remove excess amount of said second conductive layer from said second dielectric layer to form a second planarized conductive layer;

wherein said sixth and seventh etching steps sequentially follow the previous etching step.

* * * * *